United States Patent
Melanson et al.

(10) Patent No.: US 10,375,475 B2
(45) Date of Patent: Aug. 6, 2019

(54) SYSTEMS AND METHODS FOR COMPRESSING A DIGITAL SIGNAL IN A DIGITAL MICROPHONE SYSTEM

(71) Applicant: Cirrus Logic, Inc., Austin, TX (US)

(72) Inventors: John L. Melanson, Austin, TX (US); John C. Tucker, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 164 days.

(21) Appl. No.: 14/247,771

(22) Filed: Apr. 8, 2014

(65) Prior Publication Data
US 2014/0301572 A1    Oct. 9, 2014

Related U.S. Application Data

(60) Provisional application No. 61/810,075, filed on Apr. 9, 2013.

(51) Int. Cl.
*H04R 3/02* (2006.01)
*H04R 3/00* (2006.01)
(Continued)

(52) U.S. Cl.
CPC ............ *H04R 3/02* (2013.01); *H03F 1/26* (2013.01); *H03F 3/16* (2013.01); *H03M 3/00* (2013.01);
(Continued)

(58) Field of Classification Search
CPC ........ H03F 1/26; H03F 3/16; H03F 2200/372; H03F 7/3011; H03F 7/3026; H03M 3/00;
(Continued)

(56) References Cited

U.S. PATENT DOCUMENTS 4,631,749 A   12/1986   Rapaich
5,243,345 A    9/1993   Naus et al.
(Continued)

FOREIGN PATENT DOCUMENTS

CN   105264777 A   1/2016
EP     0173983 A2   3/1986
(Continued)

OTHER PUBLICATIONS

International Search Report and Written Opinion, International Application No. PCT/GB2014/051262, dated Sep. 22, 2014, 18 pages.
(Continued)

*Primary Examiner* — Andrew L Sniezek
(74) *Attorney, Agent, or Firm* — Jackson Walker L.L.P.

(57) ABSTRACT

In accordance with embodiments of the present disclosure, a digital microphone system may include a microphone transducer and a digital processing system. The microphone transducer may be configured to generate an analog input signal indicative of audio sounds incident upon the microphone transducer. The digital processing system may be configured to convert the analog input signal into a first digital signal having a plurality (e.g., more than 3) of quantization levels, and in the digital domain, process the first digital signal to compress the first digital signal into a second digital signal having fewer quantization levels (e.g., +1, 0, −1) than that of the first digital signal.

32 Claims, 2 Drawing Sheets

(51) Int. Cl.
| | |
|---|---|
| *H03M 3/00* | (2006.01) |
| *H03M 7/32* | (2006.01) |
| *H03M 7/36* | (2006.01) |
| *H03F 1/26* | (2006.01) |
| *H03F 3/16* | (2006.01) |
| *H04R 29/00* | (2006.01) |
| *H04R 19/04* | (2006.01) |

(52) U.S. Cl.
CPC ............ *H03M 3/39* (2013.01); *H03M 3/424* (2013.01); *H03M 7/3026* (2013.01); *H03M 7/3028* (2013.01); *H04R 3/00* (2013.01); *H04R 3/002* (2013.01); *H04R 3/007* (2013.01); *H04R 29/001* (2013.01); *H03F 2200/372* (2013.01); *H03M 3/458* (2013.01); *H03M 3/50* (2013.01); *H04R 19/04* (2013.01)

(58) Field of Classification Search
CPC ........ H03M 3/39; H03M 3/412; H03M 3/424; H03M 3/50; H03M 7/3011; H03M 7/3026; H03M 7/3028; H03M 7/3037; H03M 3/458; H04R 3/00; H04R 3/002; H04R 19/04; H04R 3/007; H04R 29/001
See application file for complete search history.

(56) References Cited

U.S. PATENT DOCUMENTS

| | | | |
|---|---|---|---|
| 5,247,210 A | 9/1993 | Swanson | |
| 5,603,088 A | 2/1997 | Gorday et al. | |
| 6,566,942 B2 | 5/2003 | Shigenobu | |
| 6,724,332 B1 | 4/2004 | Melanson | |
| 6,738,004 B2 | 5/2004 | Melanson | |
| 6,809,572 B2 | 10/2004 | Yi et al. | |
| 6,822,594 B1 | 11/2004 | Melanson et al. | |
| 6,879,275 B1 | 4/2005 | Melanson | |
| 6,933,871 B2 | 8/2005 | Melanson et al. | |
| 6,956,919 B2 | 10/2005 | Amar et al. | |
| 7,081,843 B2 | 7/2006 | Melanson | |
| 7,084,798 B2 | 8/2006 | Melanson | |
| 7,110,460 B1 | 9/2006 | Melanson et al. | |
| 7,116,721 B1 | 10/2006 | Melanson et al. | |
| 7,138,934 B2 | 11/2006 | Melanson | |
| 7,148,830 B2 | 12/2006 | Melanson | |
| 7,164,379 B1 | 1/2007 | Rao | |
| 7,170,434 B2 | 1/2007 | Melanson | |
| 7,183,957 B1 | 2/2007 | Melanson | |
| 7,187,312 B2 | 3/2007 | Melanson | |
| 7,190,294 B2 | 3/2007 | Melanson | |
| 7,196,647 B2 | 3/2007 | Melanson | |
| 7,205,917 B2 | 4/2007 | Magrath | |
| 7,298,305 B2 | 11/2007 | Melanson | |
| 7,358,881 B2 | 4/2008 | Melanson | |
| 7,450,047 B1 | 11/2008 | Wu | |
| 7,649,484 B1 | 1/2010 | Wegener | |
| 8,396,230 B2* | 3/2013 | Chang ................. | G10L 21/0364 379/406.03 |
| 8,890,051 B2 | 11/2014 | Funakoshi | |
| 8,907,829 B1 | 12/2014 | Naderi | |
| 9,076,654 B2 | 7/2015 | Zanchi | |
| 9,332,345 B1 | 5/2016 | Melanson et al. | |
| 9,419,562 B1 | 8/2016 | Melanson et al. | |
| 2001/0014122 A1 | 8/2001 | Fu et al. | |
| 2003/0095606 A1 | 5/2003 | Horowitz et al. | |
| 2007/0018866 A1 | 1/2007 | Melanson | |
| 2007/0127761 A1* | 6/2007 | Poulsen ............... | H03M 7/3015 381/355 |
| 2009/0278721 A1 | 11/2009 | Hamashita | |
| 2009/0295615 A1 | 12/2009 | Steiner | |
| 2010/0057474 A1* | 3/2010 | Kong ............................ | 704/500 |
| 2011/0112668 A1 | 5/2011 | Sorensen et al. | |
| 2011/0150260 A1 | 6/2011 | Miles | |
| 2012/0128181 A1 | 5/2012 | Lin et al. | |
| 2012/0224722 A1 | 9/2012 | Nystrom | |
| 2013/0051582 A1 | 2/2013 | Kropfitsch et al. | |
| 2013/0058495 A1 | 3/2013 | Furst | |
| 2013/0108074 A1 | 5/2013 | Reining | |
| 2013/0271307 A1 | 10/2013 | Kropfitsch et al. | |
| 2013/0335131 A1 | 12/2013 | Ceballos et al. | |
| 2014/0140538 A1 | 5/2014 | Kropfitsch et al. | |
| 2014/0301571 A1 | 10/2014 | Melanson et al. | |
| 2014/0301572 A1 | 10/2014 | Melanson et al. | |
| 2014/0323844 A1 | 10/2014 | Deliwala | |
| 2014/0341397 A1 | 11/2014 | Straeussnigg et al. | |
| 2015/0086043 A1 | 3/2015 | Sridharan et al. | |
| 2015/0380005 A1 | 12/2015 | Chesney | |

FOREIGN PATENT DOCUMENTS

| | | |
|---|---|---|
| EP | 2421281 A2 | 2/2012 |
| EP | 2984759 A2 | 2/2016 |
| EP | 2984760 A2 | 2/2016 |
| GB | 2459862 A | 11/2009 |
| GB | 2459864 A | 11/2009 |
| GB | 2485270 A | 5/2012 |
| GB | 2508612 A | 6/2014 |
| GB | 2513406 A | 10/2014 |
| GB | 2530605 A | 3/2016 |
| WO | 2013182901 A1 | 12/2013 |
| WO | 2014168934 A2 | 10/2014 |
| WO | 2014168939 A2 | 10/2014 |
| WO | 2014174283 A1 | 10/2014 |
| WO | 2015200267 A2 | 12/2015 |

OTHER PUBLICATIONS

Search Report under Section 17, GB Patent Application No. GB1307576.7, dated Oct. 9, 2013, 3 pages.
Zhou, et al, Precompensated excitation waveforms to suppress harmonic generation in MEMS electrostatic transducers, IEEE Transactions on Ultrasonics, Ferroelectrics and Frequency Control, vol. 51, Issue 11, Nov. 2004, pp. 1564-1574.
Jawed, Syed Arsalan, CMOS Readout Interfaces for MEMS Capacitive Microphones, Mar. 31, 2009, Retrieved from the Internet: http://eprints-phd.biblio.unitn.it/82/1/thesis_mems_microphone_readout.pdf.
O'Neal, J.B., Delta Modulation Quantizing Noise Analytical and Computer Simulation Results for Gaussian and Television Input Signals, Bell Systems Technical Journal, Jan. 1966, pp. 117-141.
International Search Report and Written Opinion, International Application No. PCT/US2014/033314, dated Nov. 7, 2014, 17 pages.
International Search Report and Written Opinion, International Application No. PCT/US2014/033302, dated Nov. 7, 2014, 10 pages.
Bloom, I. and Nemirovsky, Y.; 1/f Noise Reduction of Metal-Oxide-Semiconductor Transistors by Cycling from Inversion to Accumulation, Appl. Phys. Lett. 48 (15), Apr. 15, 1991, American Institute of Physics, pp. 1164-1666.
Koh, Jeongwook; Low-Frequency-Noise Reduction Technique for Linear Analog CMOS IC's, Dissertation, Lehrstuhl fur Technische Elektroniks der Technischen Universitat Munchen; 2005, 113 pages.
Kolhatkar, J.S., Salm, C., Knitel, M.J., and Wallinga, H.; Constant and Switched Bias Low Frequency Noise in p-MOSFETs with Varying Gate Oxide Thickness ESSDERC 2002, pp. 83-86.
Ersoy, Selcuk, Van Veldhoven, Robert H.M., Sebastiano, Fabio, Reimann, Klaus, Makinwa, Kofi A.A.; A 0.25mm2 AC-Biased MEMS Microphone Interface with 28dBA SNR, ISSCC 2013 / Session 22 / Sensors & Displays / 22.2, 2013 IEEE International Solid-State Circuits Conference, Digest of Technical Papers, Feb. 20, 2013, pp. 382-383.
International Search Report and Written Opinion, International Application No. PCT/US2015/037101, dated Jan. 4, 2016, 20 pages.
Anonymous: Data compression—Wikipedia, the free encyclopedia, Jun. 17, 2014, Retrieved from the Internet: https://en.wikipedia.org/w/index.php?title=Data_compression&oldid=613257125 [retrieved on Oct. 5, 2015], pp. 1-3, 7-9.

(56) References Cited

OTHER PUBLICATIONS

Anonymous: Lossless compression—Wikipedia, the free encyclopedia, Jun. 18, 2014, Retrieved from the Internet: https://en.wikipedia.org/w/index.php?title=Lossless_compression&oldid=613463592 [retrieved on Oct. 5, 2015], pp. 2-3, 5-6.

Abadi et al., Integrating compression and execution in column-oriented database systems, ACM Proceedings of SIGMOD. International Conference on Management of Data, Jun. 27, 2006, pp. 671-682.

Combined Search and Examination Report under Sections 17 and 18(3), Application No. GB1511091.9, dated Jan. 21, 2016, 8 pages.

Colodro, Francisco et al., New Continuous-Time Multibit Sigma-Delta Modulators with Low Sensitivity to Clock Jitter, IEEE Transactions on Circuits and Systems I: Regular Papers, IEEE, U.S. vol. 56, No. 1, Jan. 1, 2009, pp. 74-83.

Muda, Lindasalwa et al., Voice Recognition Algorithms using Mel Frequency Ceptral Coefficient (MFCC) and Dynamic Time Warping (DTW) Techniques, Journal of Computing (vol. 2, Issue 3), Mar. 22, 2010, pp. 138-143.

Eshraghi, A et al., A Comparison of Three Parallel Delta-Sigma A/D Converters, 1996 IEEE International Symposium on Circuits and Systems (ISCAS), IEEE, U.S., May 12, 1996, pp. 517-520.

International Search Report and Written Opinion, International Application No. PCT/US2015/037101, dated Mar. 23, 2016, 23 pages.

Definition of "equivalent", Oxford Dictionaries, https://en.oxforddictionaries.com/definition/equivalent.

Extended European Search Report, European Patent Office, Application No. EP16183887.5, dated Apr. 12, 2017.

Extended European Search Report, European Patent Office, Application No. EP16183886.7, dated Apr. 12, 2017.

Examination Report under Section 18(3), UKIPO, Application No. GB1511091.9, dated Aug. 22, 2017.

Anonymous, "USB—Wikipedia, the free encyclopedia", Dec. 30, 2012, XP055297292, retrieved from the Internet: https://en.wikipedia.org/w/index.php?title=USB&oldid=530464826 [retrieved on Aug. 24, 2016], Section: Signalling; p. 24.

Anonymous, "SLIMbus—Wikipedia", Feb. 19, 2013, XP55361583, retrieved from the Internet: https://en.wikipedia.org/w/index.php?title=SLIMbus&oldid=539008572 [retrieved on Apr. 4, 2017], Section: SLIMbus DATA and CLK; p. 4, lines 3-4.

Anonymous, "Non-return-to-zero", Aug. 18, 2010, XP055193887, retrieved from the Internet: https://en.wikipedia.org/w/index.php?title=Non-return-to-zero&oldid=379590899 [retrieved on Jun. 5, 2015], Section: Non-Return-to-Zero Inverted; p. 3, last paragraph.

Rabic, Gojko, "Signal Encoding Techniques Presentation C CSE 3461/5461: Introduction to Computer Networking & Internet Technologies", Apr. 9, 2012, XP55361422, retrieved from the Internet: http://web.cse.ohio-state.edu/~srinivasan.115/cse3461-5461/Cse3461.C.SignalEncoding.09-04-2012.pdf [retrieved Apr. 4, 2017], the whole document.

\* cited by examiner

SYSTEMS AND METHODS FOR COMPRESSING A DIGITAL SIGNAL IN A DIGITAL MICROPHONE SYSTEM

RELATED APPLICATIONS

The present disclosure claims priority to U.S. Provisional Patent Application Ser. No. 61/810,075, filed Apr. 9, 2013, which is incorporated by reference herein in its entirety.

FIELD OF DISCLOSURE

The present disclosure relates in general to audio systems, and more particularly, to compressing a digital signal in a digital microphone system.

BACKGROUND

Microphones are ubiquitous on many devices used by individuals, including computers, tablets, smart phones, and many other consumer devices. Generally speaking, a microphone is an electroacoustic transducer that produces an electrical signal in response to deflection of a portion (e.g., a membrane or other structure) of a microphone caused by sound incident upon the microphone.

In a digital microphone system, an analog output signal of the microphone transducer may be processed by an analog-to-digital converter to convert the analog output signal to a digital output signal, which may be communicated over a bus to a digital audio processor for further processing. By communicating a digital signal over the bus rather than an analog signal, the audio signal may be less susceptible to noise.

To adequately represent an audio signal with sufficient quality, the digital output signal may have numerous quantization levels. Numerous quantization levels may require a significant number of digital bits in order that each quantization level is represented by a corresponding digital code. It may be undesirable to transmit digital codes with many bits over a digital bus, particularly a serial digital bus, as communication throughput may decrease as the number of bits in digital codes increase.

SUMMARY

In accordance with the teachings of the present disclosure, certain disadvantages and problems associated with communication of a microphone signal may be reduced or eliminated.

In accordance with embodiments of the present disclosure, a digital microphone system may include a microphone transducer and a digital processing system. The microphone transducer may be configured to generate an analog input signal indicative of audio sounds incident upon the microphone transducer. The digital processing system may be configured to convert the analog input signal into a first digital signal having a plurality of quantization levels, and, in the digital domain, process the first digital signal to compress the first digital signal into a second digital signal having fewer quantization levels than that of the first digital signal.

In accordance with these and other embodiments of the present disclosure, a system may include a microphone transducer and a digital processing system. The microphone transducer may be configured to generate an analog input signal indicative of audio sounds incident upon the microphone transducer. The digital processing system may be configured to convert the analog input signal into a digital signal having a plurality of quantization levels, such that each quantization level of the digital signal is represented by one or more transitions or one or more absences of transitions of one or more bits of the digital signal.

In accordance with these and other embodiments of the present disclosure, a method may include generating an analog input signal indicative of audio sounds incident upon a microphone transducer. The method may also include converting the analog input signal into a first digital signal having a plurality of quantization levels. The method may further include, in the digital domain, processing the first digital signal to compress the first digital signal into a second digital signal having fewer quantization levels than that of the first digital signal.

In accordance with these and other embodiments of the present disclosure, a method may include generating an analog input signal indicative of audio sounds incident upon a microphone transducer. The method may also include converting the analog input signal into a digital signal having a plurality of quantization levels, such that each quantization level of the digital signal is represented by one or more transitions or one or more absences of transitions of one or more bits of the digital signal.

In accordance with these and other embodiments of the present disclosure, an integrated circuit may include a microphone input and a processing circuit. The microphone input may be configured to receive an analog input signal indicative of audio sounds incident upon a microphone transducer. The processing circuit may be configured to convert the analog input signal into a first digital signal having a plurality of quantization levels and, in the digital domain, process the first digital signal to compress the first digital signal into a second digital signal having fewer quantization levels than that of the first digital signal.

In accordance with these and other embodiments of the present disclosure, an integrated circuit may include a microphone input and a processing circuit. The microphone input may be configured to receive an analog input signal indicative of audio sounds incident upon a microphone transducer. The processing circuit may be configured to convert the analog input signal into a digital signal having a plurality of quantization levels, such that each quantization level is represented by one or more transitions or one or more absences of transitions of one or more bits of the digital signal.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
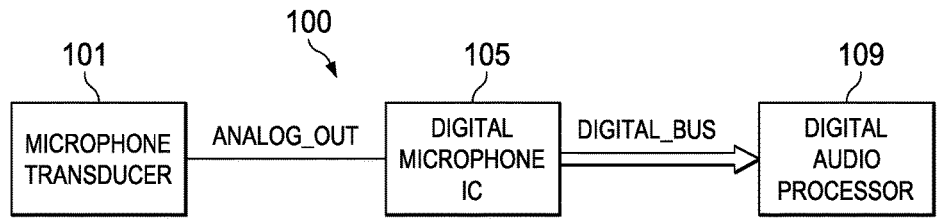
FIG. 1 illustrates a block diagram of selected components of an example audio system, in accordance with embodiments of the present disclosure.

FIG. 1 illustrates a block diagram of selected components of an example audio system 100, in accordance with embodiments of the present disclosure. As shown in FIG. 1, audio system 100 may include a microphone transducer 101, a digital microphone integrated circuit (IC) 105, and a digital audio processor 109. Microphone transducer 101 may comprise any system, device, or apparatus configured to convert sound incident at microphone transducer 101 to an electrical signal, for example an analog output signal ANALOG_OUT, wherein such sound is converted to an electrical signal using a diaphragm or membrane having an electrical capacitance that varies as based on sonic vibrations received at the diaphragm or membrane. Microphone transducer 101 may include an electrostatic microphone, a condenser microphone, an electret microphone, a microelectromechanical systems (MEMs) microphone, or any other suitable capacitive microphone.

Digital microphone IC 105 may comprise any suitable system, device, or apparatus configured to process analog output signal ANALOG_OUT to generate a digital audio output signal DIGITAL_BUS and condition digital audio output signal DIGITAL_BUS for transmission over a bus to digital audio processor 109. Once converted to digital audio output signal DIGITAL_BUS, the audio signal may be transmitted over significantly longer distances without being susceptible to noise as compared to an analog transmission over the same distance. In some embodiments, digital microphone IC 105 may be disposed in close proximity with microphone transducer 101 to ensure that the length of the analog line between microphone transducer 101 and digital microphone IC 105 is relatively short to minimize the amount of noise that can be picked up on an analog output line carrying analog output signal ANALOG_OUT. For example, in some embodiments, microphone transducer 101 and digital microphone IC 105 may be formed on the same substrate. In other embodiments, microphone transducer 101 and digital microphone IC 105 may be formed on different substrates packaged within the same integrated circuit package.

Digital audio processor 109 may comprise any suitable system, device, or apparatus configured to process digital audio output signal for use in a digital audio system. For example, digital audio processor 109 may comprise a microprocessor, microcontroller, digital signal processor (DSP), application specific integrated circuit (ASIC), or any other device configured to interpret and/or execute program instructions and/or process data, such as digital audio output signal.

Figure 2:
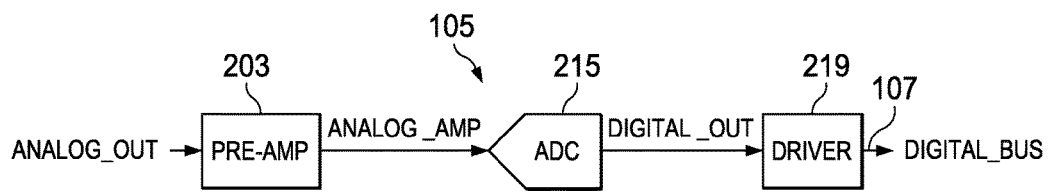
FIG. 2 illustrates a block diagram of selected components of a digital microphone integrated circuit, in accordance with embodiments of the present disclosure.

FIG. 2 illustrates a block diagram of selected components of digital microphone IC 105, in accordance with embodiments of the present disclosure. As shown in FIG. 2, digital microphone IC 105 may include a pre-amplifier 203, an analog-to-digital converter (ADC) 215, and a driver 219. Pre-amplifier 203 may receive analog output signal ANALOG_OUT via one or more input lines which may allow for receipt of a single-ended signal, differential signal, or any other suitable analog audio signal format and may comprise any suitable system, device, or apparatus configured to condition analog output signal ANALOG_OUT for processing by ADC 215. The output of pre-amplifier 203 may be communicated to ADC 215 on one or more output lines.

ADC 215 may comprise any suitable system device or apparatus configured to convert an analog audio signal received at its input, to a digital signal representative of analog output signal ANALOG_OUT. ADC 215 may itself include one or more components (e.g., delta-sigma modulator, decimator, etc.) for carrying out the functionality of ADC 215.

Driver 219 may receive the digital signal DIGITAL_OUT output by ADC 215 and may comprise any suitable system, device, or apparatus configured to condition such digital signal (e.g., encoding into Audio Engineering Society/European Broadcasting Union (AES/EBU), Sony/Philips Digital Interface Format (S/PDIF), in the process generating digital audio output signal DIGITAL_BUS for transmission over a bus to digital audio processor 109. In FIG. 2, the bus receiving digital audio output signal DIGITAL_BUS is shown as single-ended. In some embodiments, driver 219 may generate a differential digital audio output signal 107.

Figure 3:
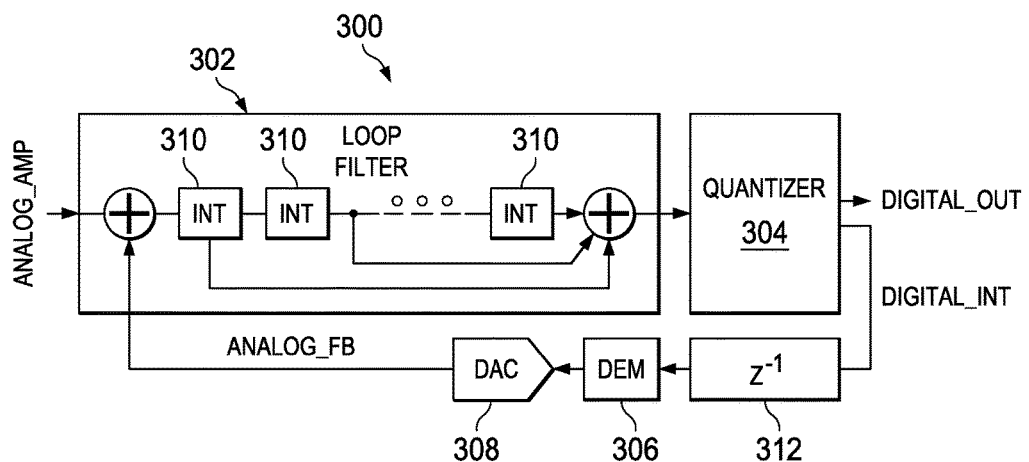
FIG. 3 illustrates a block diagram of selected components of a delta-sigma modulator, which may be used to implement the analog-to-digital converter depicted in FIG. 2, in accordance with embodiments of the present disclosure.

FIG. 3 illustrates a block diagram of selected components of a delta-sigma modulator 300, which may be used to implement ADC 215 depicted in FIG. 2, in accordance with embodiments of the present disclosure. As shown in FIG. 3, modulator 300 may include a loop filter 302, a quantizer 304, dynamic element matching circuitry (DEM) 306, a digital-to-analog converter (DAC) 308, and a delay block 312. Loop filter 302 may comprise an input summer for generating a difference between amplified analog output signal ANALOG_AMP and an analog feedback signal ANALOG_FB, and one or more integrator stages 310, such that loop filter 302 operates as analog filter of an error signal equal to the difference between amplified analog output signal ANALOG_AMP and analog feedback signal ANALOG_FB, and generates a filtered output analog signal to quantizer 304 based on amplified analog output signal ANALOG_AMP and analog feedback signal ANALOG_FB (e.g., amplified analog output signal ANALOG_AMP plus a filtered version of analog feedback signal ANALOG_FB). The output from loop filter 302 may be quantized by a quantizer 304 which may, as described in greater detail below, convert the analog input signal into a first digital signal having a plurality of quantization levels and, in the digital domain, process the first digital signal to compress the first digital signal into a second digital signal having fewer quantization levels than that of the first digital signal. Quantizer 304 may also be configured to generate a digital feedback signal DIGITAL_INT. Digital feedback signal DIGITAL_INT may be delayed by delay block 312 and fed back through DEM circuitry 306 and DAC 308 to generate analog feedback signal ANALOG_FB.

Figure 4:
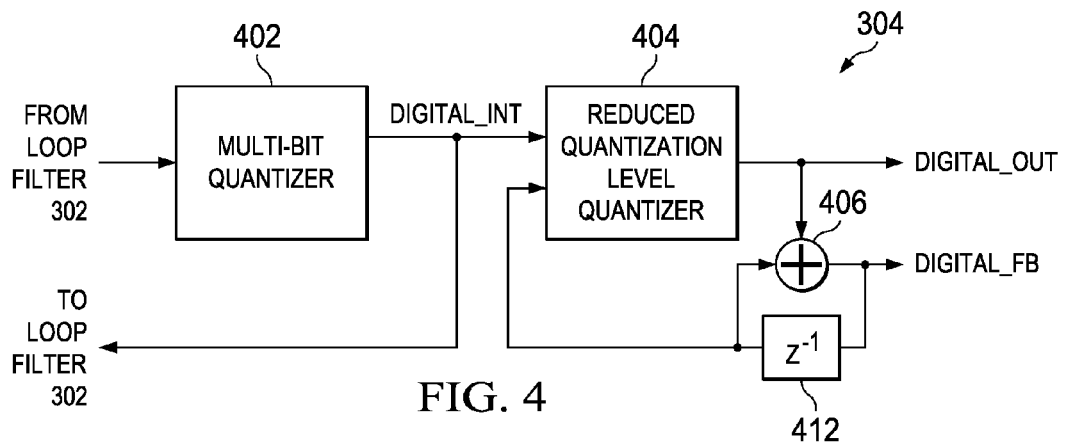
FIG. 4 illustrates a block diagram of selected components of a quantizer, in accordance with embodiments of the present disclosure.

FIG. 4 illustrates a block diagram of selected components of a quantizer 304, in accordance with embodiments of the present disclosure. As shown in FIG. 4, quantizer 304 may include a multi-bit quantizer 402, reduced quantization level quantizer 404, and digital summer 406. Multi-bit quantizer 402 may be configured to receive the analog output from loop filter 302, and convert the analog output into a first digital signal DIGITAL_INT having a plurality of quantization levels (e.g., more than three), as is known in the art. In some embodiments, first digital signal DIGITAL_INT may be a signal of length N, where N is a positive integer. In particular embodiments, N may be greater or equal to 3. First digital signal DIGITAL_INT may be fed back to loop filter 302.

Reduced quantization level quantizer 404 may in turn process the first digital signal to compress first digital signal DIGITAL_INT into a second digital signal (e.g., DIGITAL_OUT) having fewer quantization levels than that of first digital signal DIGITAL_INT. In some embodiments, second digital signal DIGITAL_OUT may be a signal of length M, where M is a positive integer less than N. In particular embodiments, M may equal to 1 or 2. As a particular example, in some embodiments, reduced quantization level quantizer 404 may generate output signals having three quantization levels: a first quantization level that corresponds to an increase in the first digital signal equal to one quantization level of first digital signal DIGITAL_INT (e.g., +1), a second quantization level that corresponds to no change of the quantization level of first digital signal DIGITAL_INT (e.g., 0), and a third quantization level that corresponds to a decrease in the first digital signal equal to one quantization level of first digital signal (e.g., −1) DIGITAL_INT. In this disclosure, the compression of the audio signal to three quantization levels may not lower fidelity of the analog-to-digital conversion performed by modulator 300, as the full, uncompressed digital signal DIGITAL_INT is fed back to loop filter 302.

As shown in FIG. 4, the second digital signal (e.g., DIGITAL_OUT) generated by reduced quantization level quantizer 404 may be based not only on first digital signal DIGITAL_INT, but also on a previous value of a digital signal DIGITAL_FB. Digital feedback signal DIGITAL_FB may be generated by digital summer 406 which has the same number of quantization levels as first digital signal DIGITAL_INT, and may be equal to a previous value of digital feedback signal DIGITAL_FB plus the current value of DIGITAL_OUT. In other words, when second digital signal DIGITAL_OUT has one of three quantization levels (e.g., −1, 0, +1), digital feedback signal DIGITAL_FB is incremented by one when second digital signal DIGITAL_OUT is +1, is unchanged when second digital signal DIGITAL_OUT is 0, and is incremented by one when second digital signal DIGITAL_OUT is −1. Thus, digital summer 406 may, along with delay block 412, serve as part of an integration/accumulation loop such that digital feedback signal DIGITAL_FB maintains a running value that approximates a current value of first digital signal DIGITAL_INT. Thus, reduced quantization level quantizer 404 may generate second digital signal DIGITAL_OUT based on the difference between first digital signal DIGITAL_INT and the previous value of digital feedback signal DIGITAL_FB. That is, if first digital signal DIGITAL_INT is one or more quantization levels more than digital feedback signal DIGITAL_FB, then reduced quantization level quantizer 404 may generate second digital signal DIGITAL_OUT as +1; if first digital signal DIGITAL_INT is one or more quantization levels less than digital feedback signal DIGITAL_FB, then reduced quantization level quantizer 404 may generate second digital signal DIGITAL_OUT as −1; and otherwise, reduced quantization level quantizer 404 may generate second digital signal DIGITAL_OUT as 0.

A receiver of digital signal DIGITAL_OUT (e.g., digital audio processor 109), may receive the digital signal DIGITAL_OUT and reconstruct a digital signal with the same number of quantization levels as first digital signal DIGITAL_INT by integrating values of digital output signal DIGITAL_OUT.

In some embodiments, the various quantization levels of the second digital signal DIGITAL_OUT may be represented by corresponding digital codes. For example, when the second digital signal has three possible quantization levels (−1, 0, +1), then each quantization level may be represented by a corresponding two-bit digital code. In such embodiments, remaining unused codes may be employed to represent and communicate a control signal associated with system 100 (e.g., a signal gain associated with the digital microphone system, a direct current bias associated with the digital microphone system, etc.).

In other embodiments, quantization levels of the second digital signal DIGITAL_OUT may not be represented by a digital code, but may instead be represented by a transition or lack of transition of second digital signal DIGITAL_OUT. For example, in embodiments in which the second digital signal DIGITAL_OUT has three quantization levels, an example encoding between signal transitions and quantization levels may be illustrated in FIG. 5. As shown in graphs 502 and 504, to represent 0, second digital signal DIGITAL_OUT may not transition during a sampling period T. As shown in graphs 506 and 508, to represent +1, second digital signal DIGITAL_OUT may transition from low to high during a sampling period T. As shown in graphs 510 and 512, represent −1, second digital signal DIGITAL_OUT may transition from high to low during a sampling period T.

Figure 5:
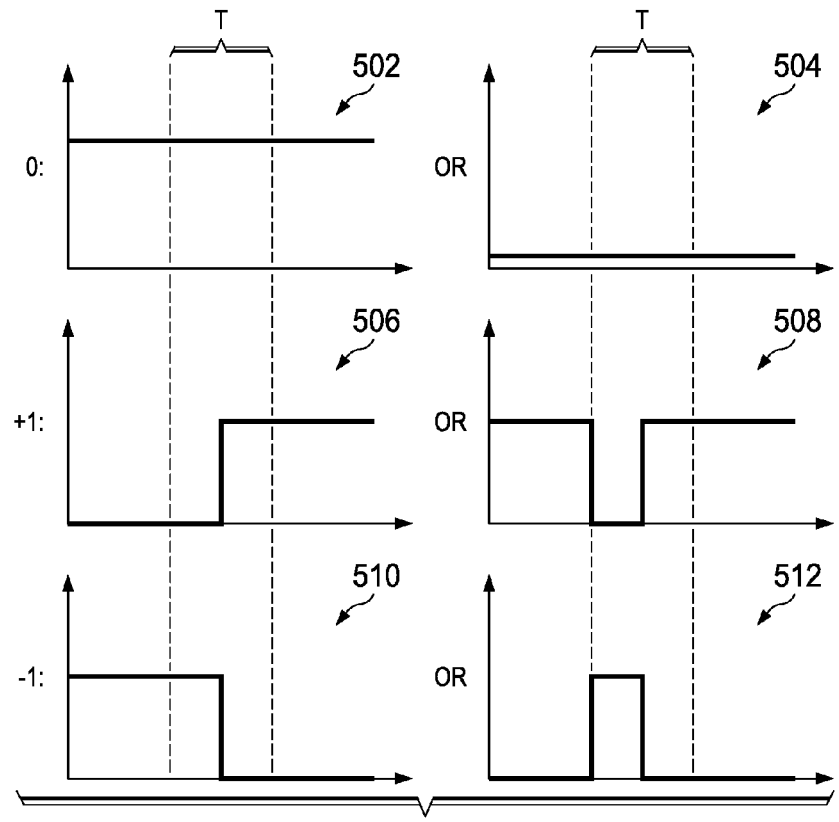
FIG. 5 illustrates graphs depicting example coding of a digital signal, in accordance with embodiments of the present disclosure.

In addition to permitting a multiple-bit signal to be carried on a single wire, the encoding scheme shown in FIG. 5 may provide for reduction in power in transmitting second digital signal DIGITAL_OUT. Often, a significant portion of power loss in signal transmission on a digital bus occurs as a result of transitions of the digital signal. However, in the case of the encoding scheme shown in FIG. 5, no transitions are present when second digital signal DIGITAL_OUT is equal to 0, and thus transmission of such value results in little or no power loss. In such embodiments, power loss may also be reduced by suppression transmission of control data when there is no transition in the data of second digital signal DIGITAL_OUT. To illustrate, in some implementations, second digital signal DIGITAL_OUT may be carried on a communication bus which is also used to carry control signals. Thus, second digital signal DIGITAL_OUT may be interleaved with one or more control signals. To prevent transitions occurring from the control signals, communication of control signals may be suppressed when the second digital signal is 0, and thus not transitioning.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A digital microphone system comprising:
a microphone transducer configured to generate an analog input signal indicative of audio sounds incident upon the microphone transducer;
a digital processing system configured to:
convert the analog input signal into a first digital signal having a plurality of quantization levels; and
in the digital domain, process the first digital signal to compress the first digital signal into a second digital signal having fewer quantization levels than that of the first digital signal, such that a third digital signal equivalent to the first digital signal can be reconstructed from the second digital signal;
wherein:
each quantization level of the second digital signal is represented by one of a plurality of possible digital codes;
the number of possible digital codes is more than the number of quantization levels of the second digital signal; and
one or more of the possible digital codes not corresponding to quantization levels represent a control signal associated with the digital microphone system.

2. The system of claim 1, wherein the microphone transducer and the digital processing system are formed on a single substrate.

3. The system of claim 1, wherein the microphone transducer and the digital processing system are formed on different substrates packaged within the same integrated circuit package.

4. The system of claim 1, wherein the microphone transducer comprises a microelectromechanical systems microphone.

5. The system of claim 1, wherein:
each quantization level of the first digital signal is represented by an N-bit digital code, wherein N is a positive integer; and
each quantization level of the second digital signal is represented by an M-bit digital code, wherein M is a positive integer less than N.

6. The system of claim 5, wherein:
the second digital signal has three quantization levels, including:
a first quantization level that corresponds to an increase in the first digital signal equal to one quantization level of the first digital signal;
a second quantization level that corresponds to no change of the quantization level of the first digital signal; and
a third quantization level that corresponds to a decrease in the first digital signal equal to one quantization level of the first digital signal; and
the quantization level of the second digital signal is represented by a transition or lack of transition of the second digital signal.

7. The system of claim 6, wherein the digital processing system is further configured to:
communicate the second digital signal on a bus interleaved with one or more control signals; and
suppress communication of control signals when the second digital signal is of the second quantization level.

8. The system of claim 1, wherein the control signal represents a signal gain associated with the digital microphone system.

9. The system of claim 1, wherein the control signal represents a direct current bias associated with the digital microphone system.

10. The system of claim 1, wherein the third digital signal is reconstructed by integrating values of the second digital signal.

11. The system of claim 1, wherein the second digital signal is indicative of a change, if any, between successive samples of the first digital signal.

12. A system comprising:
a microphone transducer configured to generate an analog input signal indicative of audio sounds incident upon the microphone transducer; and
a digital processing system configured to convert the analog input signal into a digital signal having a plurality of quantization levels, such that each quantization level is uniquely obtained by a determined transition or of one or more bits of the digital signal during a sampling period of the digital signals;
wherein:
the digital signal has three quantization levels, including:
a first quantization level that corresponds to an increase in the analog input signal;
a second quantization level that corresponds to no change of the analog input signal; and
a third quantization level that corresponds to a decrease in the analog input signal;
the quantization level of the digital signal is represented by a transition or lack of transition of the digital signal; and
the digital processing system is further configured to:
communicate the digital signal on a bus interleaved with one or more control signals; and
suppress communication of control signals when the digital signal is of the second quantization level.

13. A method comprising:
generating an analog input signal indicative of audio sounds incident upon a microphone transducer;
converting the analog input signal into a first digital signal having a plurality of quantization levels; and
in the digital domain, processing the first digital signal to compress the first digital signal into a second digital signal having fewer quantization levels than that of the first digital signal, such that a third digital signal equivalent to the first digital signal can be reconstructed from the second digital signal;
wherein:
each quantization level of the second digital signal is represented by one of a plurality of possible digital codes;
the number of possible digital codes is more than the number of quantization levels of the second digital signal; and
one or more of the possible digital codes not corresponding to quantization levels represent a control signal associated with the digital microphone system.

14. The method of claim 13, wherein the control signal represents a signal gain associated with the digital microphone system.

15. The method of claim 13, wherein the control signal represents a direct current bias associated with the digital microphone system.

16. The method of claim 13, wherein:
each quantization level of the first digital signal is represented by an N-bit digital code, wherein N is a positive integer; and
each quantization level of the second digital signal is represented by an M-bit digital code, wherein M is a positive integer less than N.

17. The method of claim 16, wherein:
the second digital signal has three quantization levels, including:
a first quantization level that corresponds to an increase in the first digital signal equal to one quantization level of the first digital signal;
a second quantization level that corresponds to no change of the quantization level of the first digital signal; and
a third quantization level that corresponds to a decrease in the first digital signal equal to one quantization level of the first digital signal; and
the quantization level of the second digital signal is represented by a transition or lack of transition of the second digital signal.

18. The method of claim 17, further comprising:
communicating the second digital signal on a bus interleaved with one or more control signals; and
suppressing communication of control signals when the second digital signal is of the second quantization level.

19. The method of claim 13, wherein the microphone transducer comprises a microelectromechanical systems microphone.

20. The method of claim 13, wherein the third digital signal is reconstructed by integrating values of the second digital signal.

21. The method of claim 13, wherein the second digital signal is indicative of a change, if any, between successive samples of the first digital signal.

22. A method comprising:
generating an analog input signal indicative of audio sounds incident upon a microphone transducer;
converting the analog input signal into a digital signal having a plurality of quantization levels, such that each quantization level is uniquely obtained by a determined transition or of one or more bits of the digital signal during a sampling period of the digital signal, wherein:
the digital signal has three quantization levels, including:
a first quantization level that corresponds to an increase in the analog input signal;
a second quantization level that corresponds to no change of the analog input signal; and
a third quantization level that corresponds to a decrease in the analog input signal; and
the quantization level of the digital signal is represented by a transition or lack of transition of the digital signal;
communicating the digital signal on a bus interleaved with one or more control signals; and
suppressing communication of control signals when the digital signal is of the second quantization level.

23. An integrated circuit comprising:
a microphone input configured to receive an analog input signal indicative of audio sounds incident upon a microphone transducer; and
a processing circuit configured to:
convert the analog input signal into a first digital signal having a plurality of quantization levels; and
in the digital domain, process the first digital signal to compress the first digital signal into a second digital signal having fewer quantization levels than that of the first digital signal, such that a third digital signal equivalent to the first digital signal can be reconstructed from the second digital signal;
wherein:
each quantization level of the second digital signal is represented by one of a plurality of possible digital codes;
the number of possible digital codes is more than the number of quantization levels of the second digital signal; and
one or more of the possible digital codes not corresponding to quantization levels represent a control signal associated with the digital microphone system.

24. The integrated circuit of claim 23, wherein the microphone transducer comprises a microelectromechanical systems microphone.

25. The integrated circuit of claim 23, wherein:
each quantization level of the first digital signal is represented by an N-bit digital code, wherein N is a positive integer; and
each quantization level of the second digital signal is represented by an M-bit digital code, wherein M is a positive integer less than N.

26. The integrated circuit of claim 25, wherein:
the second digital signal has three quantization levels, including:
a first quantization level that corresponds to an increase in the first digital signal equal to one quantization level of the first digital signal;
a second quantization level that corresponds to no change of the quantization level of the first digital signal; and
a third quantization level that corresponds to a decrease in the first digital signal equal to one quantization level of the first digital signal; and
the quantization level of the second digital signal is represented by a transition or lack of transition of the second digital signal.

27. The integrated circuit of claim 26, wherein the processing circuit is further configured to:
communicate the second digital signal on a bus interleaved with one or more control signals; and
suppress communication of control signals when the second digital signal is of the second quantization level.

28. The integrated circuit of claim 23, wherein the control signal represents a signal gain associated with the digital microphone system.

29. The integrated circuit of claim 23, wherein the control signal represents a direct current bias associated with the digital microphone system.

30. The integrated circuit of claim 23, wherein the third digital signal is reconstructed by integrating values of the second digital signal.

31. The integrated circuit of claim 23, wherein the second digital signal is indicative of a change, if any, between successive samples of the first digital signal.

32. An integrated circuit comprising:
a microphone input configured to receive an analog input signal indicative of audio sounds incident upon a microphone transducer; and
a processing circuit configured to convert the analog input signal into a digital signal having a plurality of quantization levels, such that each quantization level is uniquely obtained by a determined transition or of one or more bits of the digital signal during a sampling period of the digital signal;
wherein:
  the digital signal has three quantization levels, including:
    a first quantization level that corresponds to an increase in the analog input signal;
    a second quantization level that corresponds to no change of the analog input signal; and
    a third quantization level that corresponds to a decrease in the analog input signal;
  the quantization level of the digital signal is represented by a transition or lack of transition of the digital signal; and
  the processing circuit is further configured to:
    communicate the digital signal on a bus interleaved with one or more control signals; and
suppress communication of control signals when the digital signal is of the second quantization level.

* * * * *